US006985002B2

(12) United States Patent
Salcedo

(10) Patent No.: US 6,985,002 B2
(45) Date of Patent: Jan. 10, 2006

(54) SYSTEM AND METHOD FOR INPUT/OUTPUT INDUCED LATCH UP DETECTION

(75) Inventor: Jorge L. Salcedo, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/747,975

(22) Filed: Dec. 29, 2003

(65) Prior Publication Data

US 2004/0246016 A1   Dec. 9, 2004

Related U.S. Application Data

(60) Provisional application No. 60/476,097, filed on Jun. 5, 2003.

(51) Int. Cl.
*G01R 31/26* (2006.01)

(52) U.S. Cl. .................................. 324/765; 324/769

(58) Field of Classification Search ............... 324/754, 324/763–765, 768–769, 158.1; 257/139, 257/147, 355–356, 372, E27.063; 361/56–57, 361/91.1, 101
See application file for complete search history.

(56) References Cited

U.S. PATENT DOCUMENTS 5,825,600 A * 10/1998 Watt ............................ 361/56
6,469,538 B1 * 10/2002 Gupta ......................... 324/769
6,636,067 B1   10/2003 Salcedo-Suner

OTHER PUBLICATIONS

Jorge Salcedo-Suner, "A New Induced Latchup Phenomenon Generated By Overvoltage Stress In Voltage Tolerant ESD Protection Circuits", Texas Instruments, Inc, (date unknown).

* cited by examiner

*Primary Examiner*—Minh N. Tang
(74) *Attorney, Agent, or Firm*—Willaim B. Kempler; W. James Brady, III; Frederick J. Telecky, Jr.

(57) ABSTRACT

The present invention is directed to a system and method of testing an integrated circuit (IC) device for potential latch-up. The system has a power supply configured to supply a maximum voltage to the integrated circuit device. The system uses a current measuring device for measuring current between the power supply and the circuit device. The system includes an overvoltage source that is operative to apply an overvoltage pulse to one input pin that is designated a test pin while the maximum supply voltage is applied to each other input pin of the integrated circuit device. The current measuring device detects whether a latch up condition exists by detecting an increase in current between the power supply and the device based application of the overvoltage pulse.

20 Claims, 3 Drawing Sheets

SYSTEM AND METHOD FOR INPUT/OUTPUT INDUCED LATCH UP DETECTION

CROSS REFERENCE TO RELATED APPLICATION

This application claims the benefit of U.S. Provisional Application No. 60/476,097, which was filed Jun. 5, 2003, and entitled "A New Induced Latchup Phenomenon Generated by Overvoltage Stress in Voltage Tolerant ESD Protection Circuits", the entire contents of which is incorporated herein by reference.

TECHNICAL FIELD

The present invention is directed to systems and methods for testing devices, and more particularly to systems and methods of testing integrated circuit (IC) devices.

BACKGROUND OF THE INVENTION

It is well known that a four-layer sandwich of doped material NPNP, forms a silicon-controlled rectifier (SCR). Once an SCR is "fired" (switched to its 'ON' or conducting state), it continues to conduct until its gate signal is removed. In certain devices, an SCR can be unintentionally formed by the mere presence of interleaved N and P doped materials. The SCR is undesirable for certain applications, since inadvertent firing of an SCR will usually result in excessive current flow through the device. This excessive current flow can result in destructive failure of an integrated circuit with unintentionally formed SCRs.

Complementary-symmetry Metal-Oxide Semiconductor (CMOS) devices have parasitic SCR structures built in to the CMOS device. The inadvertent firing of a parasitic SCR in a CMOS device is termed latch-up. A CMOS designer therefore designs the CMOS device to avoid circuit latch-up, since a malfunction of the CMOS integrated circuit may occur caused by the firing of a parasitic PNPN structure inherent in the CMOS device. Latch-up, as used herein, means a state in which a low impedance path results from an overstress that triggers a parasitic SCR structure and that persists after removal or cessation of the trigger condition. Therefore, testing for latch-up during device testing is important to isolate devices with latch-up problems.

SUMMARY OF THE INVENTION

The present invention is directed to a system and method of testing an integrated circuit (IC) device for potential latch-up, where the integrated circuit device has a power supply pin and at least one input pin. The system has a power supply configured to supply a maximum voltage and a current measuring device for measuring current between the power supply and the IC device. An overvoltage source is connected to a test pin. The overvoltage source applies an overvoltage pulse to the test pin of the at least one input pin, while the maximum supply voltage is applied to each of the other input pins. The current measuring device detects whether a latch up condition exists by detecting an increase in current between the power supply and the device based on application of the overvoltage pulse. The system may also include a switching system configured for sequentially connecting each input to be tested to the overvoltage source while each other input pin is connected to the power supply.

Another aspect of the present invention is directed to a system for testing a device, where the device comprises a power supply input and a plurality of inputs. The system comprises means for supplying a maximum supply voltage and means for measuring current between the means for supplying a maximum supply voltage and the device. The system also has means for generating an overvoltage pulse. The system further includes means for selecting a test input by coupling a test input of the plurality of inputs to the means for generating an overvoltage pulse and coupling each other input of the plurality of inputs to the means for supplying. Additionally, the system has means for determining a latch up conditioning by detecting an increase in current from the power supply upon application of the overvoltage pulse to the test input.

Another aspect of the present invention is directed to a method for testing an integrated circuit (IC) device having a power supply input, a plurality of inputs and a plurality of outputs. The method comprises applying a maximum supply voltage to the power supply input and applying maximum supply voltage to the plurality of inputs, which the plurality of outputs remains unconnected. The method further comprises selecting a test pin by decoupling an input from the maximum supply voltage and applying an overvoltage pulse to the test pin. The method detects whether a latch up condition exists by detecting whether current to the IC device increased upon applying the overvoltage pulse.

BRIEF DESCRIPTION OF THE DRAWINGS

The foregoing and other aspects of the present invention will become apparent to those skilled in the art to which the present invention relates upon reading the following description with reference to the accompanying drawings.

DETAILED DESCRIPTION

The present invention is directed to a system and method for testing circuits for a latch-up condition. Testing for latch-up during device testing is important to isolate devices with latch-up problems. CMOS devices have inherent parasitic SCR structures that are formed during the fabrication of transistors in a semiconductor substrate. For example, transistor devices are formed by interleaving P doped and N doped regions on a substrate that is either a P doped or N doped material. The interleaving of these doped materials can form a parasitic SCR between transistor cells (e.g., two inverter devices). The parasitic device can be inadvertently turned fired or turned on when experiencing an overvoltage condition resulting in damage to the CMOS device.

The firing (turning on) of a parasitic SCR is termed latch-up in CMOS circuits. Latch-up, as used herein, means a state in which a low impedance path results from an overstress that triggers a parasitic SCR structure and that persists after removal or cessation of the trigger condition. More specifically, micro-latch-up is a malfunction state in which a low-impedance path between I/O pin(s) and ground (GND), between I/O pins and the power supply, or between the power supply and GND is created by sinking or pulling current from the I/O pin(s) or the power supply as a result of a current and/or voltage overstress (triggering condition) in neighboring pin(s), which persists after removal or cessation of the triggering condition.

Conventional latch-up tests test and stress currents on I/O's (positive and negative) and over-voltage stress in power supplies. However, conventional latch-up tests do not detect all of the low-impedance paths in an IC. The present invention provides a solution by applying an over-voltage stress at the I/O's to stress the internal power rail and internal substrate diodes in order to detect internal low impedance paths and substrate trigger points that could not be detected by conventional latch-up tests.

Figure 1:
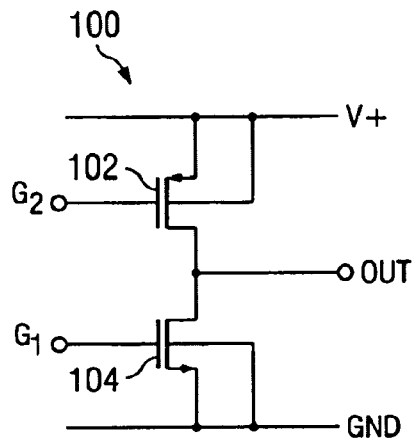
FIG. 1 is a schematic diagram illustrating two CMOS transistors that produce a parasitic SCR in the associated substrates.

FIG. 1 is a simple schematic diagram of a device 100 illustrating two CMOS transistors 102, 104 that produce a parasitic SCR in their associated substrates. The two CMOS transistors include a P-type transistor and an n-type transistor coupled in an inverted configuration. This configuration inherently has a PNPN structure that forms a parasitic SCR.

Figure 2:
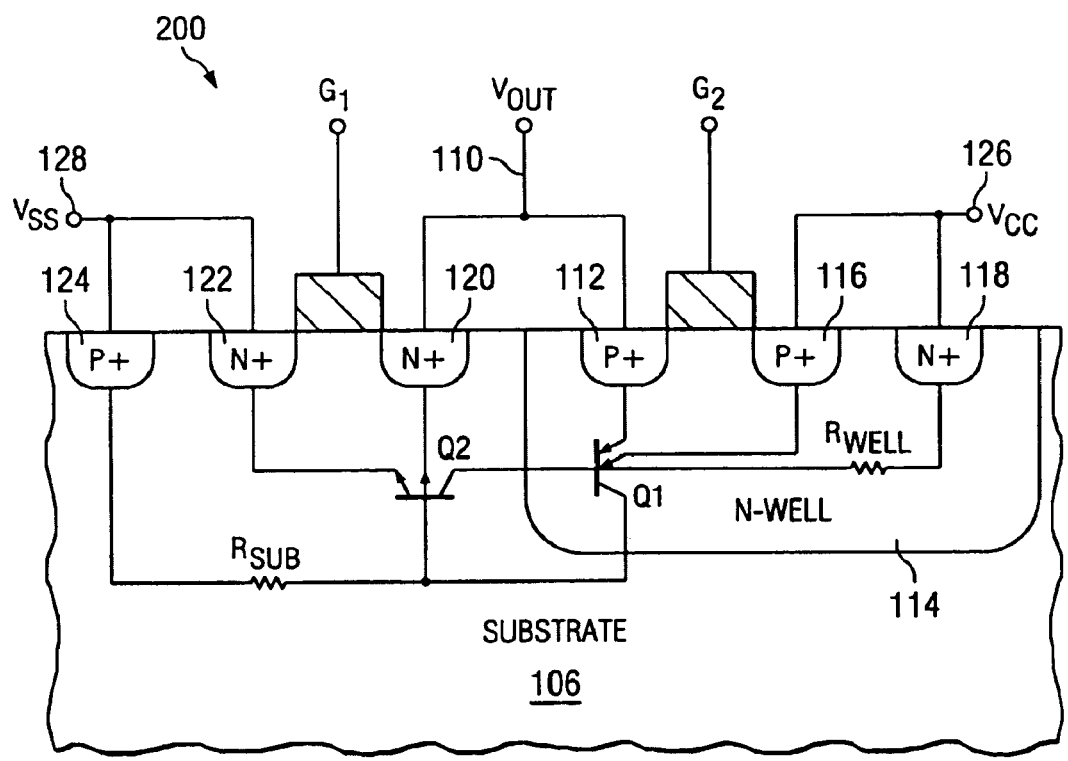
FIG. 2 is a schematic cross section of the circuit shown in FIG. 1 illustrating how the parasitic SCR is formed in the substrate.

FIG. 2 illustrates a cross section of the device 100 shown in FIG. 1 showing how the parasitic SCR is formed in the P-SUBSTRATE 106 and the N-WELL region 114. The P-SUBSTRATE 106 has an internal resistance RSub and the N-WELL region 106 has an internal resistance RWell. One transistor, Q2 is in the P-Substrate 106, and another transistor Q1 is in the N-Well region 114. The parasitic SCR between output VOUT 110 and VCC 126 can be seen to be formed via p implant/deposition region 112, n-well region 114, p implant/deposition region 116, and n+ implant/deposition region 118 (PNPN). The parasitic SCR can conduct current equally well in both directions. The parasitic SCR between VOUT 110 and VSS 128 can be seen to be formed via n implant/deposition region 120, p-substrate region 106, n implant/deposition region 122, and p+ implant/deposition 124 (NPNP).

Figure 3:
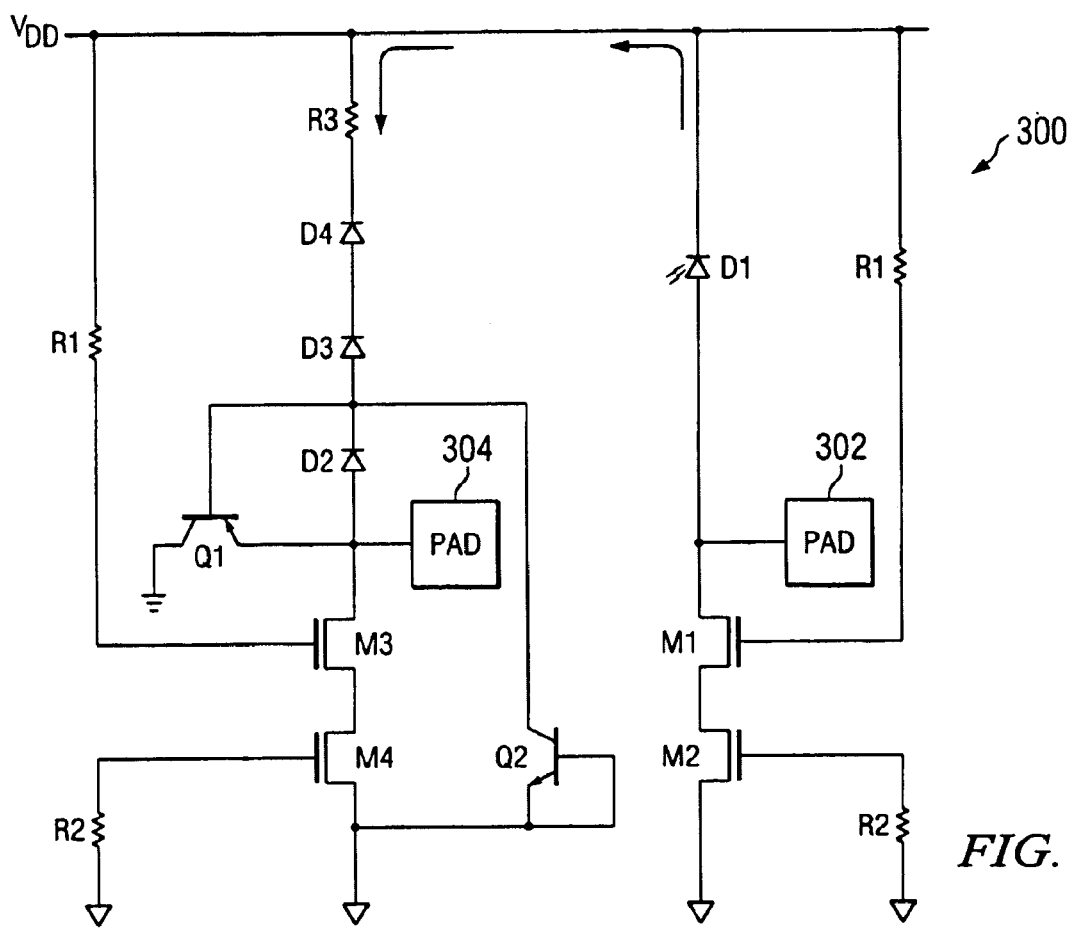
FIG. 3 is a schematic diagram of an input/output signal pin protection circuit with interaction from another cell due to an overvoltage condition.

FIG. 3 is a schematic diagram illustrating a device 300 having two ESD protection circuits. The first ESD protection circuit comprises CMOS transistors M1, M2 connected from input/output pin/pad (I/O PAD) 302 to GND, and diode D1, connected from I/O PAD 302 to the internal power rail VDD. The second ESD protection circuit comprises CMOS transistors M3, M4 connected from I/O PAD 304 to GND, and diodes D2, D3, D4, and resistor R3 connected from I/O PAD 304 to VDD. The actual number of diodes D1, D2, D3, D4 can vary depending on the voltage tolerant requirements for a given design.

An SCR path can be created between the I/O pin/pad PAD and ground (GND) or VDD. The placement of D1 with respect to the cascode transistors M1 and M2 form a protective electrostatic discharge (ESD) structure. The parasitic PNP built into D1 pumps the local substrate, which turns on the composite parasitic NPN formed between the drain of transistor M3 and the source of transistor M4.

Device 300 has a parasitic SCR that has its anode tied to the I/O PAD 304 and not directly to VDD. Current can flow from the I/O PAD 304 to GND through the parasitic SCR if the voltage at the I/O PAD 304 is higher than the holding voltage of the parasitic SCR. A stress condition sufficient to activate the parasitic SCR and induce a latch-up condition may be triggered by an adjacent I/O cell, or noise, among other things. Induced latch-up caused by a parasitic PNPN structure, for example, associated with the second ESD protection circuit as a consequence of stress applied on an another (e.g. the first) ESD protection circuit may cause the second ESD protection circuit to sink a high amount of current from its associated I/O PAD 304 connection.

When an over-voltage pulse is applied to the I/O PAD 302, it can forward bias D1, conducting the voltage peak to the internal power rail (VDD). During this time, a current event into the substrate can be present when diode D1 is conducting if diode D1 is built as a lateral diode. A parasitic PNP region built into D1 pumps the local substrate which turns on the composite NPN regions formed between the drain M1 and source of M2. The over-voltage stress can become a current event in the substrate, acting as a trigger of an SCR event for a neighboring circuit. For example, if two similar cells with a substrate trigger are neighboring cells, the first cell can easily pull down the second cell and trigger a parasitic SCR event which clamps the pad of the second cell to the supply voltage. This can occur when the over-voltage pulse applied to the first cell is higher than the holding voltage for a parasitic SCR in the second cell. When an over-voltage occurs, the 0.7 volt drop from D1 can be transferred to the internal power rail VDD, making any low impedance path fail latch up.

As illustrated in FIG. 3, when a latch up occurs, the base and emitter of transistor Q1 appears across D2 of the neighboring cell, where the emitter is coupled to the neighboring cell's PAD 304, and the base to the cathode of D1. Thus, the voltage drop across D2 appears across the base and emitter of Q1, causing Q1 to conduct. The collector of Q1 is connected to GND. This clamps the neighboring cell's PAD 304 to the supply voltage. The base and emitter of a second transistor Q2 of the neighboring cell are tied to ground, while its collector is connected to the base of Q1. Once the parasitic SCR is turned on, current flows from PAD to GND via Q1, which can cause damage to the device 300.

Figure 4:
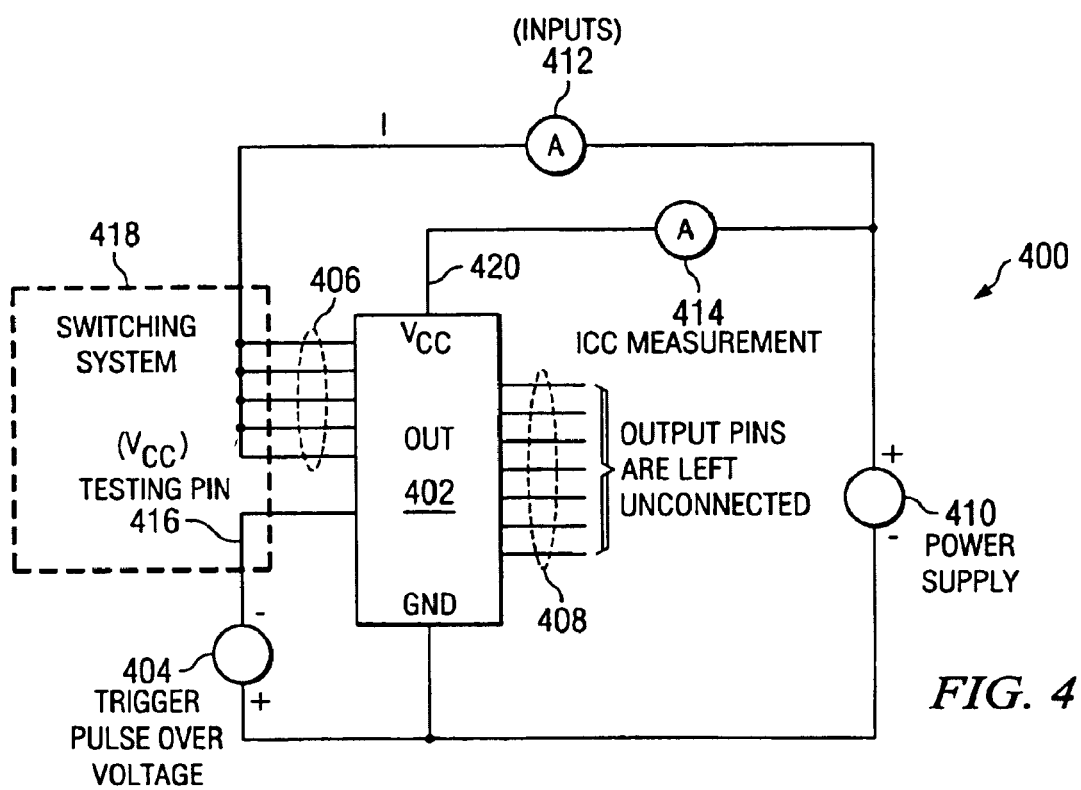
FIG. 4 illustrates a test setup in accordance with an aspect of the present invention.

FIG. 4 illustrates a system 400 in accordance with an aspect of the present invention. The system 400 can test an integrated circuit (IC) 402 for induced latch-up and detect low impedance paths that could not be discovered using conventional testing techniques. The IC 402 has input pins 406 and output pins 408. The number of input and output pins can vary from at least one, to any number greater than one. Power from a power supply 410 is supplied to a power supply input (VCC) 420 and to input pins 406. For testing, the power supply 410 can be set at the maximum allowable level for the IC 402. The output pins 408 remain unconnected during the test. A first current measuring device 412 measures current from the power supply 410 to the inputs 406. A second current measuring device 414 measures current to the power supply input 418. Alternatively, a single current measuring device (not shown) can also be used. A trigger pulse over-voltage source 404 sends a voltage pulse to testing pin 416. The voltage pulse can have the maximum amplitude and pulse width allowed by the specification for IC 402. Induced latch-up is detected by monitoring current measuring devices 412 and 414. The current is measured before the application of the voltage pulse, and again after the pulse is applied to test pin 416. If the measured current increased by a certain amount after the voltage pulse is applied (e.g., by 3 mA or more), then an induced latch-up has occurred, indicating IC 402 has a low impedance path. If an induced latch-up occurs, a redesign of the circuit may be in order.

Optionally, the system 400 can include a switching system 418 so that each input pin of IC 402 can be tested. The switching system 418 would select a test pin 416, remove power from pin 416, connect pin 416 to the trigger pulse over-voltage source 404, and then proceed with the test. Upon completion of the testing of the test pin 416, the switching system would then restore power to test pin 416 by connecting it to the power supply 410, and select another one of input pins 406 for testing. The switching system 418 can cycle through each input pin 406 by coupling the test pin to the overvoltage source and coupling the remaining input pins to the maximum supply voltage.

For example, for testing a voltage tolerant ESD protection circuit such as illustrated in FIG. 3 with a 3.3V supply voltage, the power supply can be set to 5V. A trigger pulse of about 7 V to about 11V can be applied. The trigger pulse can have a ramp time of about four nanoseconds (4 ns), a pulse width of about eleven nanoseconds (11 ns), and a drop time of about four nanoseconds (4 ns). The current to the input pins and to the power supply input is measured before the trigger pulse is applied. The current is constantly monitored during the test and if upon application of the pulse, or after application of the pulse it is observed that the current to the inputs, and/or the current to the power supply increased by about 3 mA or more, then an induced latch up occurred.

Figure 5:
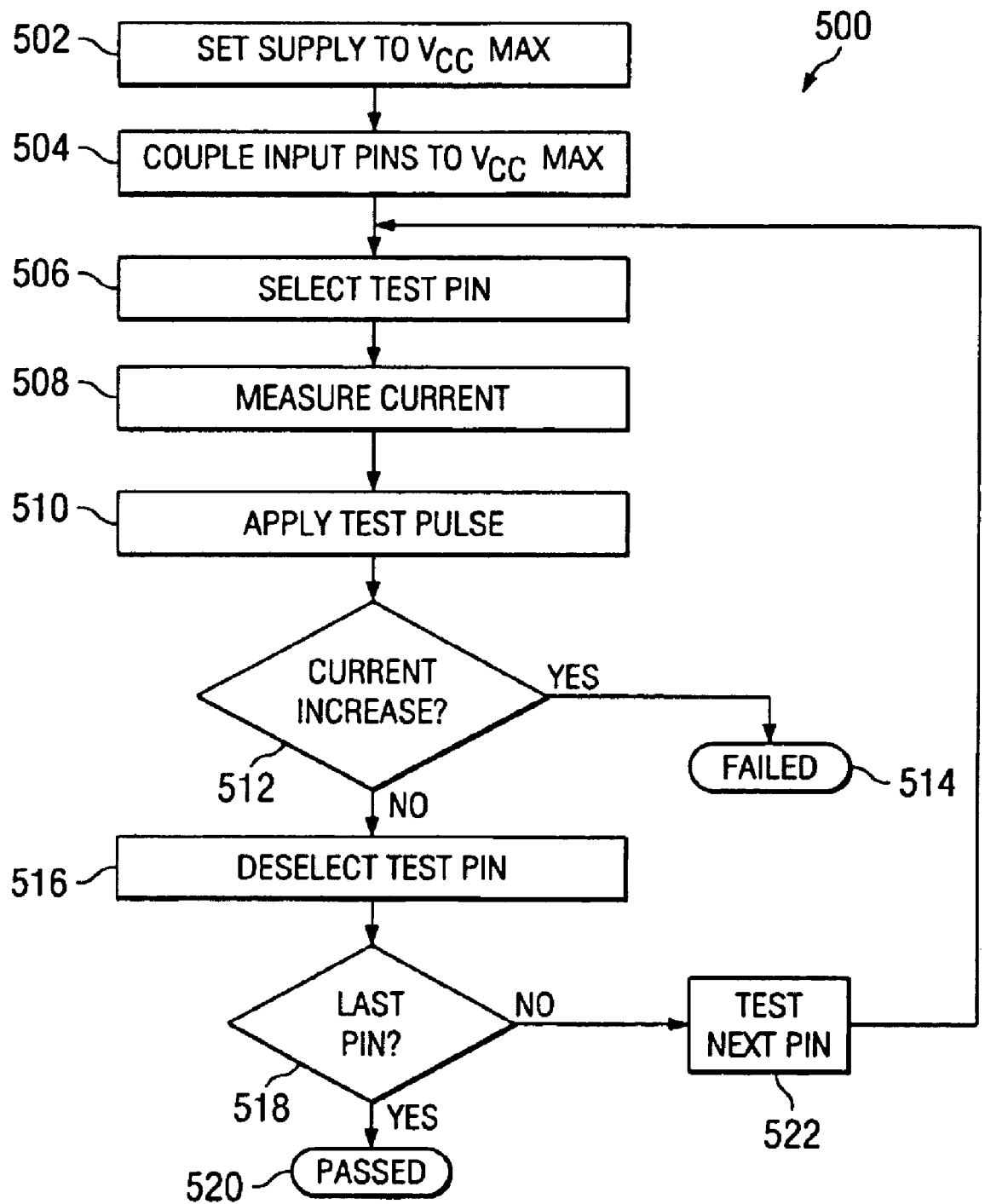
FIG. 5 illustrates a test methodology in accordance with an aspect of the present invention.

FIG. 5 illustrates a methodology 500 in accordance with an aspect of the present invention for testing a circuit for a latch-up condition. At 502, a supply voltage is set to a maximum level. The maximum voltage can be the maximum supply voltage (e.g., maximum supply voltage limit of an integrated circuit) that a device under test (DUT) is designed to operate. For example, if a 3.3 V DUT is capable of operating at 5V, then the supply voltage should be set to 5V instead of 3.3 V. At 504, all input pins except a test pin are connected to a power supply and set to the maximum allowable supply voltage. As with the power supply input, the maximum supply voltage is the maximum supply voltage that the DUT can operate. If the maximum voltage is the same as the power supply input voltage, then the I/O pins can be connected to the same power supply as the power supply input. At 506, the test pin is selected.

A switching mechanism can be used to select a test input pin by removing the supply voltage and coupling the test pin to an overvoltage source. A switching mechanism can be used to cycle through selection of each input pin of the IC for overvoltage testing. The test pin can then be connected to a voltage pulse generator that will apply the over-voltage test pulse. At 508, the current to the device is measured. The measured current can be at least one of the current to the device's power supply input and the input pins. At 510, a test pulse is applied to the test pin. The test pulse can be the maximum pulse duration and amplitude allowed for the DUT. For example, the pulse width can be about 11 ns, with a maximum ramp time of about 4 ns and a maximum drop time of about 4 ns for a total of about 19 ns. For a 3.3 V device, the pulse amplitude can be about 7 V to about 11 V, depending on the circuit's design specification.

At 512, the current is measured and compared with the current measured before the pulse was applied (at 508). If the current has increased by at least about three milliamps (3 mA) (YES), then an induced latch up has occurred and the device has failed the test as shown at 514. At 514, power is removed from the device. If at 512 a current increase was not observed (NO), then at 516 the test pin is deselected. The deselecting process includes removing the test pin from the voltage pulse generator and connecting the test pin to the maximum power supply voltage. At 518, it is determined whether the last pin has been tested. If the last pin has been tested (YES) and no overvoltage condition has occurred, the device has successfully passed the test as shown at 520. If the last pin has not been tested (NO), then a new test pin is selected and the testing procedure is repeated for the new test pin.

While, for purposes of simplicity of explanation, a methodology is shown and described as executing serially, it is to be understood and appreciated that the present invention is not limited by the order shown, as some aspects may, in accordance with the present invention, occur in different orders and/or concurrently from that shown and described herein. Moreover, not all features shown or described may be needed to implement a methodology in accordance with the present invention. Additionally, such methodology can be implemented in hardware (e.g., one or more integrated circuits), software (e.g., running on a DSP or ASIC) or a combination of hardware and software.

What is claimed is:

1. A system for testing an integrated circuit (IC) device having a power supply pin and at least one input pin, comprising:
   a power supply configured to supply a maximum voltage;
   a current measuring device for measuring current between the power supply and the IC device; and
   an overvoltage source operative to apply an overvoltage pulse, wherein the overvoltage pulse is applied to a test pin of the at least one input pin and the maximum supply voltage is applied to each other input pin of the at least one input pin, the current measuring device detecting whether a latch up condition exists by detecting an increase in current between the power supply and the IC device based on application of the overvoltage pulse.

2. The system of claim 1, further comprising a switching system configured for sequentially connecting each input to be tested to the overvoltage source while each other input pin is connected to the power supply.

3. The system of claim 1, the current measuring device configured to detect a latch up condition by detecting a current increase of about at least three milliamps.

4. The system of claim 1, the current measuring device further comprises:
   a first current measuring device for measuring current between the power supply and the power supply pin; and
   a second current measuring device for measuring current between the power supply and the each other input pin of the at least one input pin.

5. The system of claim 4, the current measuring device detecting a latch up condition by detecting an increase in current in at least one of the first current measuring device and the second current measuring device upon application of the overvoltage pulse.

6. The system of claim 4, the overvoltage source configured to supply an overvoltage pulse with at least one of about a four nanosecond ramp time, about an eleven nanosecond pulse width, and about a four nanosecond drop time.

7. The system of claim 1, the IC device comprises a Complementary Metal-Oxide Semiconductor (CMOS) voltage tolerant electrostatic discharge device with a maximum power supply voltage of about 3.3 volts, the trigger overvoltage source configured to supply an overvoltage pulse greater than about 3.3 volts and less than about 11 volts.

8. A system for testing an integrated circuit (IC) device having a power supply pin and at least one input pin, comprising:
   a power supply configured to supply a maximum voltage;
   a current measuring device for measuring current between the power supply and the IC device;

an overvoltage source operative to apply an overvoltage pulse, wherein the overvoltage pulse is applied to a test input pin of the at least one input pin and the maximum supply voltage is applied to each other input pin of the at least one input pin, the current measuring device detecting whether a latch up condition exists by detecting an increase in current between the power supply and the IC device based on application of the overvoltage pulse; and a switching system configured for sequentially connecting each input pin to be tested to the overvoltage source while each other input pin is connected to the power supply.

9. The system of claim 8, the current measuring device further comprises:
 a first current measuring device for measuring current between the power supply and the power supply pin; and
 a second current measuring device for measuring current between the power supply and the each other input pin of the at least one input pin.

10. The system of claim 9, the current measuring device detecting a latch up condition by detecting an increase in current in at least one of the first current measuring device and the second current measuring device upon application of the overvoltage pulse.

11. A system for testing a device, the device comprising a power supply input and a plurality of inputs, the system comprising:
 means for supplying a maximum supply voltage;
 means for measuring current from the means for supplying a maximum supply voltage to the device;
 means for generating an overvoltage pulse;
 means for selecting a test input by coupling a test input of the plurality of inputs to the means for generating an overvoltage pulse and coupling each other input of the plurality of inputs to the means for supplying a maximum supply voltage; and
 means for determining a latch up condition by detecting an increase in current from the means for supplying a maximum supply voltage upon application of the overvoltage pulse to the test input.

12. The system of claim 11, the means for measuring current further comprising:
 means for measuring current between the means for supplying a maximum supply voltage and the power supply input; and
 means for measuring current between the means for supplying a maximum supply voltage and the each other input of the plurality of inputs.

13. The system of claim 12, the means for determining a latch up condition by detecting the increase from at least one of the means for measuring current between the means for supplying a maximum supply voltage and the power supply input, and the means for measuring current between the power supply and the each other input of the plurality of inputs.

14. The system of claim 11, the means for selecting a test input comprising sequentially selecting each of the other plurality of inputs for overvoltage testing.

15. A method for testing an integrated circuit (IC) device with a power supply input, a plurality of inputs and a plurality of outputs, the method comprising:
 applying a maximum supply voltage to the power supply input;
 applying maximum supply voltage to the plurality of inputs;
 selecting a test pin by decoupling an input of the plurality of inputs from the maximum supply voltage and applying an overvoltage pulse to the test pin; and
 detecting whether a latch up condition exists by detecting whether current to the IC device increased upon applying the overvoltage pulse.

16. The method of claim 15, the detecting a latch up condition further comprising:
 performing a first current measurement to the device before applying the overvoltage pulse;
 performing a second current measurement to the device after applying the overvoltage pulse; and
 comparing the first current measurement and the second current measurement to determine if a current increase to the IC device has occurred.

17. The method of claim 15, the detecting whether current to the IC device increased upon applying the overvoltage pulse comprising detecting whether current increased from at least one of the current to the power supply input and the current to the plurality of inputs.

18. The method of claim 15, further comprising sequentially selecting a new test input from the plurality of inputs for each of the plurality of inputs by coupling the test input to the maximum supply voltage, decoupling the new test input from the maximum supply voltage and applying an overvoltage pulse to the new test pin.

19. The method of claim 15, the detecting whether a latch up condition exists comprises determining whether the current increased by about at least three milliamps.

20. The method of claim 15, the overvoltage pulse having at least one of about a four nanosecond maximum rise time, about an eleven nanosecond maximum pulse width, and about a four nanosecond maximum drop time.

* * * * *